US012588555B2

(12) United States Patent
Chen

(10) Patent No.: US 12,588,555 B2
(45) Date of Patent: Mar. 24, 2026

(54) DUAL SIDED MOLDED PACKAGE WITH VARYING INTERCONNECT PAD SIZES AND VARYING EXPOSED SOLDERABLE AREA

(71) Applicant: Skyworks Solutions, Inc., Irvine, CA (US)

(72) Inventor: Howard E. Chen, Anaheim, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 656 days.

(21) Appl. No.: 17/929,499

(22) Filed: Sep. 2, 2022

(65) Prior Publication Data

US 2023/0139251 A1      May 4, 2023

Related U.S. Application Data

(60) Provisional application No. 63/263,216, filed on Oct. 28, 2021, provisional application No. 63/263,219, filed on Oct. 28, 2021.

(51) Int. Cl.
| | |
|---|---|
| *H01L 25/10* | (2006.01) |
| *H01L 21/48* | (2006.01) |
| *H01L 23/31* | (2006.01) |
| *H01L 23/498* | (2006.01) |
| *H01L 23/552* | (2006.01) |

(Continued)

(52) U.S. Cl.
CPC ........ *H01L 25/105* (2013.01); *H01L 21/4853* (2013.01); *H01L 23/3128* (2013.01); *H01L 23/49816* (2013.01); *H01L 23/49833* (2013.01); *H01L 23/49838* (2013.01); *H01L 23/552* (2013.01); *H01L 23/66* (2013.01);

*H01L 25/50* (2013.01); *H01L 24/16* (2013.01); *H01L 2223/6605* (2013.01); *H01L 2223/6644* (2013.01); *H01L 2223/6677* (2013.01); *H01L 2224/16225* (2013.01); *H01L 2225/1023* (2013.01); *H01L 2225/1058* (2013.01); *H01L 2924/14215* (2013.01);

(Continued)

(58) Field of Classification Search
None
See application file for complete search history.

(56) References Cited

U.S. PATENT DOCUMENTS

| | | | | | |
|---|---|---|---|---|---|
| 5,598,036 | A | * | 1/1997 | Ho | H05K 3/3436 |
| | | | | | 257/737 |
| 7,564,130 | B1 | * | 7/2009 | Li | H01L 24/13 |
| | | | | | 257/772 |

(Continued)

*Primary Examiner* — Long Pham
(74) *Attorney, Agent, or Firm* — Knobbe, Martens, Olson & Bear, LLP

(57) ABSTRACT

A dual sided molded package has a substrate with pads of varying size configured to receive electrically conductive interconnect members thereon. The pads include first pads that have a larger surface area than a surface area of second pads. In one implementation, one or more first pads are proximate the corners of the substrate. First interconnect members are attached to the first pads and second interconnect members are attached to the second pads. The first interconnect members have an exposed solderable area that is substantially equal to the surface area of the first pads, and the second interconnect members have an exposed solderable area that is substantially equal to the surface area of the second pads. The first exposed solderable area is larger than the second exposed solderable area.

20 Claims, 10 Drawing Sheets

(51) Int. Cl.
    *H01L 23/66*         (2006.01)
    *H01L 25/00*         (2006.01)
    *H01L 23/00*         (2006.01)

(52) U.S. Cl.
    CPC .................. *H01L 2924/182* (2013.01); *H01L 2924/2027* (2013.01); *H01L 2924/3025* (2013.01)

(56) References Cited

U.S. PATENT DOCUMENTS

| | | | |
|---|---|---|---|
| 8,766,453 B2 * | 7/2014 | Uehling | H01L 23/49838 |
| | | | 257/773 |
| 8,948,712 B2 | 2/2015 | Chen et al. | |
| 9,041,472 B2 | 5/2015 | Chen et al. | |
| 9,071,335 B2 | 6/2015 | Agarwal et al. | |
| 9,202,747 B2 | 12/2015 | Chen et al. | |
| 9,252,107 B2 | 2/2016 | Read et al. | |
| 9,295,157 B2 | 3/2016 | Chen et al. | |
| 9,419,667 B2 | 8/2016 | Lobianco et al. | |
| 9,506,968 B2 | 11/2016 | Hoang et al. | |
| 9,564,937 B2 | 2/2017 | Lobianco et al. | |
| 9,761,537 B2 | 9/2017 | Chen et al. | |
| 9,955,582 B2 | 4/2018 | Kuhlman et al. | |
| 10,043,763 B2 | 8/2018 | Chen | |
| 10,361,145 B2 | 7/2019 | Chen et al. | |
| 10,497,656 B2 | 12/2019 | Chen et al. | |
| 10,729,001 B2 | 7/2020 | Branchevsky et al. | |
| 11,476,291 B2 | 10/2022 | Wakiyama et al. | |
| 11,527,462 B2 * | 12/2022 | Sakuma | H01L 23/5384 |
| 12,261,127 B2 | 3/2025 | Lobianco et al. | |
| 12,362,267 B2 | 7/2025 | Nguyen et al. | |
| 2007/0132090 A1 * | 6/2007 | Kuwabara | H05K 3/3436 |
| | | | 257/E23.07 |
| 2008/0217708 A1 | 9/2008 | Reisner et al. | |
| 2016/0035679 A1 | 2/2016 | Chen et al. | |
| 2016/0095224 A1 | 3/2016 | Chen | |
| 2018/0096951 A1 | 4/2018 | Chen et al. | |
| 2018/0226271 A1 | 8/2018 | Chen et al. | |
| 2018/0226361 A1 | 8/2018 | Chen et al. | |
| 2019/0348379 A1 | 11/2019 | Kuo et al. | |
| 2020/0066692 A1 | 2/2020 | Wolter et al. | |
| 2023/0135057 A1 | 5/2023 | Chen | |

* cited by examiner

14B′,32B″

50B 14B,30B″

90

100

DUAL SIDED MOLDED PACKAGE WITH VARYING INTERCONNECT PAD SIZES AND VARYING EXPOSED SOLDERABLE AREA

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to packaging of circuit devices, such as radio frequency modules that can be mounted on a circuit board, and more particularly to packaging of circuit devices with varying interconnect pad sizes.

Description of Related Technology

Circuit devices, such as radio frequency modules, can be implemented in a packaged module. Such devices can be connected to a mother board (e.g., of an electronic device) via solder balls. Drop tests are often performed to test the connection between the mother board and the circuit devices (e.g., the connection provided by the solder balls). As the size of the pads of circuit boards (e.g., mother boards) in electronic devices decrease (e.g., to decrease the size of the electronic device), which require a corresponding decrease in size of the connections in packages mounted to the circuit board, stresses during drop tests result in increased failure rate of packages.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In accordance with one aspect of the disclosure, a packaged circuit device is provided with varying solder interconnect pad sizes that improve a drop test performance of the packaged circuit device.

In accordance with one aspect of the disclosure, a packaged circuit device is provided with a plurality of pads of varying size configured to receive solder interconnect members thereon. The package has one or more first pads that have a surface area (e.g., exposed or solderable surface area) that is larger than a surface area (e.g., exposed or solderable surface area) of the one or more second pads of the package. In one implementation, the one or more first pads are proximate the corners of the package.

In accordance with one aspect of the disclosure, a packaged circuit device is provided with a plurality of pads of varying size configured to receive solder interconnect members thereon. The package has one or more first pads that have a surface area (e.g., exposed or solderable surface area) that is larger than a surface area (e.g., exposed or solderable surface area) of the one or more second pads of the package. In one implementation, the one or more first pads are proximate the corners of the package. The package includes one or more first solder interconnect members configured attached to the one or more first pads and one or more second solder interconnect members attached to the one or more second pads, wherein the one or more first solder interconnect members have an exposed solderable area that is smaller than the surface area (e.g., exposed or solderable surface area) of the one or more first pads and wherein the one or more second solder balls have an exposed solderable area that is substantially equal to the surface area (e.g., exposed or solderable surface area) of the one or more second pads.

In accordance with one aspect of the disclosure, a packaged circuit device is provided with a plurality of pads of varying size configured to receive solder interconnect members thereon. The package has one or more first pads that have a surface area (e.g., exposed or solderable surface area) that is larger than a surface area (e.g., exposed or solderable surface area) of the one or more second pads of the package. In one implementation, the one or more first pads are proximate the corners of the package. The package includes one or more first solder interconnect members configured attached to the one or more first pads and one or more second solder interconnect members attached to the one or more second pads. The one or more first solder interconnect members have an exposed solderable area that is substantially equal to the surface area (e.g., exposed or solderable surface area) of the one or more first pads and wherein the one or more second solder interconnect members have an exposed solderable area that is substantially equal to the surface area (e.g., exposed or solderable surface area) of the one or more second pads.

In accordance with one aspect of the disclosure, a dual sided molded package is provided. The dual sided molded package comprises a substrate having a first side and an opposite second side. A plurality of pads are attached to the second side of the substrate and include one or more first pads having a first surface area and one or more second pads having a second surface area that is smaller than the first surface area. A plurality of electrically conductive interconnect members are attached to the plurality of pads and include one or more first interconnect members attached to the one or more first pads and having a first solderable area and one or more second interconnect members attached to the one or more second pads and having a second solderable area. The first solderable area is smaller than the first surface area and the second solderable area is substantially equal to the second surface area.

In accordance with another aspect of the disclosure, a wireless device is provided. The wireless device comprises a circuit board having a plurality of metal pads with a uniform surface area, and a dual sided molded package mounted on the circuit board. The dual sided molded package includes a substrate having a first side and an opposite second side. A plurality of pads are attached to the second side of the substrate and include one or more first pads having a first surface area and one or more second pads having a second surface area that is smaller than the first surface area. A plurality of electrically conductive interconnect members are attached to the plurality of pads and include one or more first interconnect members attached to the one or more first pads and having a first solderable area and one or more second interconnect members attached to the one or more second pads and having a second solderable area. The first solderable area is smaller than the first surface area and the second solderable area is substantially equal to the second surface area. The first interconnect members and the second interconnect members are connected to the plurality of metal pads of the circuit board, the first solderable area and the second solderable area being substantially equal to the uniform surface area of the plurality of metal pads.

In accordance with another aspect of the disclosure, a method of making a dual sided molded package is provided. The method includes forming or providing a substrate having a first side and an opposite second side. A plurality of pads are attached to the second side of the substrate and include one or more first pads having a first surface area and one or more second pads having a second surface area that is smaller than the first surface area. The method also includes depositing a plurality of electrically conductive interconnect members on the plurality of pads, including depositing first interconnect members on the first pads and second interconnect members on the second pads, the first interconnect members being larger than the second interconnect members. The method also includes removing a portion of an overmolding and a portion of the first interconnect members and a portion of the second interconnect members. The method also includes reflowing a remaining portion of the first interconnect members to form first final interconnect members having a first solderable area and reflowing a remaining portion of the second interconnect members to form second final interconnect members having a second solderable area, the first solderable area being smaller than the first surface area and the second solderable area being substantially equal to the second surface area.

In accordance with one aspect of the disclosure, a dual sided molded package is provided. The dual sided molded package comprises a substrate having a first side and an opposite second side. A plurality of pads are attached to the second side of the substrate and include one or more first pads having a first surface area and one or more second pads having a second surface area that is smaller than the first surface area. A plurality of electrically conductive interconnect members are attached to the plurality of pads and include one or more first interconnect members attached to the one or more first pads and having a first solderable area and one or more second interconnect members attached to the one or more second pads and having a second solderable area. The first solderable area is substantially equal to the first surface area and the second solderable area is substantially equal to the second surface area.

In accordance with another aspect of the disclosure, a wireless device is provided. The wireless device comprises a circuit board having a plurality of metal pads including one or more first metal pads and one or more second metal pads, the one or more first metal pads having a larger surface area than a surface area of the second metal pads, and a dual sided molded package mounted on the circuit board. The dual sided molded package includes a substrate having a first side and an opposite second side. A plurality of pads are attached to the second side of the substrate and include one or more first pads having a first surface area and one or more second pads having a second surface area that is smaller than the first surface area. A plurality of electrically conductive interconnect members are attached to the plurality of pads and include one or more first interconnect members attached to the one or more first pads and having a first solderable area and one or more second interconnect members attached to the one or more second pads and having a second solderable area. The first solderable area is substantially equal to the first surface area and the second solderable area is substantially equal to the second surface area. The first interconnect members and the second interconnect members are connected to the plurality of first metal pads and second metal pads, respectively, first solderable area being substantially equal to the surface area of the first metal pads, the second solderable area being substantially equal to the surface area of the second metal pads.

In accordance with another aspect of the disclosure, a method of making a dual sided molded package is provided. The method includes forming or providing a substrate having a first side and an opposite second side. A plurality of pads are attached to the second side of the substrate and include one or more first pads having a first surface area and one or more second pads having a second surface area that is smaller than the first surface area. The method also includes depositing a plurality of electrically conductive interconnect members on the plurality of pads, including depositing first interconnect members on the first pads and second interconnect members on the second pads, the first interconnect members being larger than the second interconnect members. The method also includes removing a portion of an overmolding and a portion of the first interconnect members and a portion of the second interconnect members. The method also includes reflowing a remaining portion of the first interconnect members to form first final interconnect members having a first solderable area and reflowing a remaining portion of the second interconnect members to form second final interconnect members having a second solderable area, the first solderable area being substantially equal to the first surface area and the second solderable area being substantially equal to the second surface area.

BRIEF DESCRIPTION OF THE DRAWINGS

Embodiments of this disclosure will now be described, by way of non-limiting example, with reference to the accompanying drawings.

DETAILED DESCRIPTION

Figure 1A:
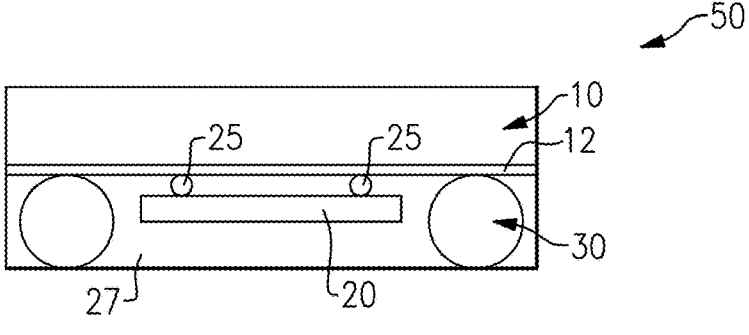
FIG. 1A is a schematic side view of a package following a bottom overmolding step.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Figure 1B:
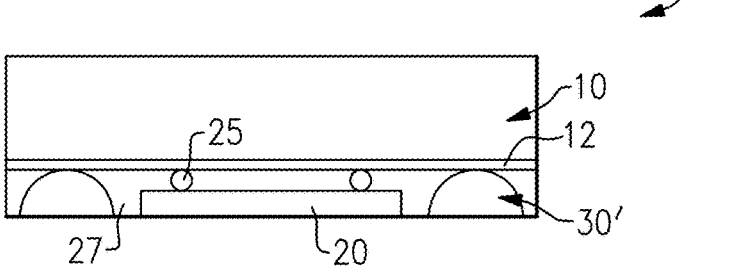
FIG. 1B is a schematic side view of the package following removal of bottom overmolding.
Figure 1C:
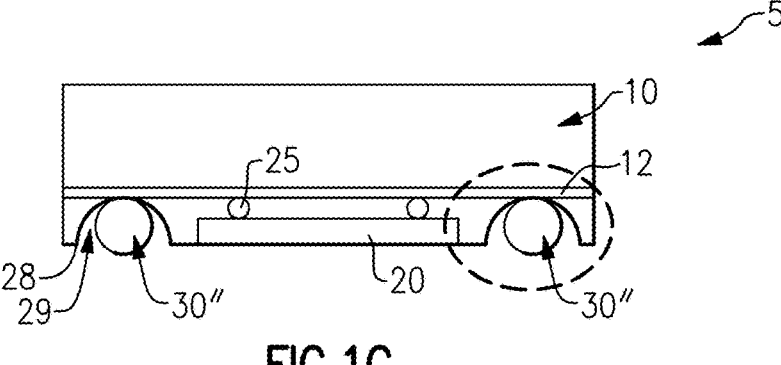
FIG. 1C is a schematic side view of the package following reflow of solder interconnect members.

FIGS. 1A-1C show a packaged circuit device or package 50 in different stages during the manufacturing process of the package 50. The package 50 has a first component (e.g., a shielded package) 10. In one implementation, the package 50 optionally has a second component 20 attached to or mounted to the first component 10, for example by electrical connectors such as interconnect members 25 (e.g., solder balls, solder joints, metallic connection posts), so that the package 50 is a dual-sided package. In other implementations, the second component 20 is excluded. The first component 10 and/or second component 20 can include one or more circuit components, such as dies (e.g., semiconductor dies), filters, amplifiers (e.g., low noise, power), switches, memory, processors, transceivers and control circuits. In one implementation, the package 50 can include circuit components that facilitate transmission and/or reception of radio frequency (RF) signals. The first component 10 can include an overmold structure (e.g., surrounding, enveloping the one or more circuit components) to facilitate radio frequency shielding of at least a portion of the one or more circuits of the first component 10.

A plurality of electrically conductive interconnect members 30 (e.g., solder balls, solder joints, metallic connection posts) can be connected to the first component 10, for example in an array, such as a ball grid array (BGA), as further described below. As shown in FIGS. 1A-1C, at least a portion of the second component 20 and the interconnect members 30 can be covered by an overmold (e.g., a bottom overmold structure) 27. The bottom overmold 27 can facilitate radio frequency shielding of at least a portion of the second component 20 (e.g., of at least a portion of the one or more circuit components of the second component 20). Though the figures show the interconnect members 30 as ball shaped, one of skill in the art will recognize the interconnect members can have other suitable shapes, such as cylindrical posts.

FIG. 1A shows the bottom overmold 27 completely covering the interconnect members 30 (e.g., of solder material, such as solder balls having a generally circular shape) and second component 20. FIG. 1B shows at least a portion of the bottom overmold 27 and interconnect members 30 removed (e.g., via ablation, via grinding) to expose at least a portion of the interconnect members 30 or through-mold connections through the bottom overmold 27. As shown in FIG. 1B, interconnect members 30, following the removal of said portion of the bottom overmold 27 and material of the interconnect members 30, where the interconnect members 30 are ball shaped, attain a non-spherical shape 30' (e.g., a generally hemispherical shape, a spheric section). FIG. 1C shows the interconnect members 30" or through-mold connections after a reflow process in which the interconnect members 30' change in shape from the non-spherical shape to a generally spherical shape. The interconnect members 30" protrude past a bottom surface 28 of the bottom overmold 27 and have a shape (e.g., volume) that is smaller than a shape (e.g., volume) of the interconnect members 30, so that a gap 29 exists between the bottom overmold 27 and the interconnect member 30" (e.g. a gap about the circumference of the interconnect member 30").

Figure 2:
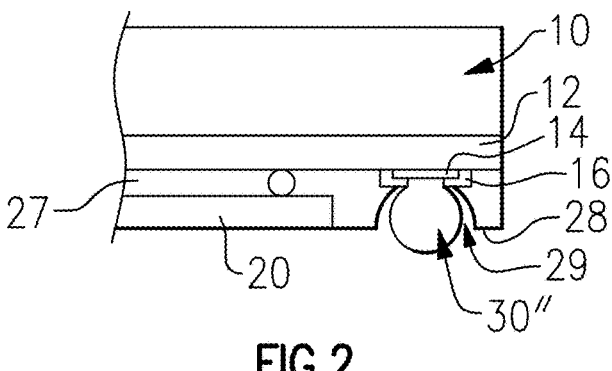
FIG. 2 is a schematic enlarged view of a solder interconnect members connected to a pad of the package in FIG. 1C.

FIG. 2 is an enlarged view of a portion of the package 50 in FIG. 1C, which shows that the bottom of the first component (e.g., a shielded package) 10 includes a substrate 12 (e.g., a packaging substrate). One or more pads 14 are disposed on (e.g., attached to, formed on) the bottom of the first component 10 (e.g., attached to the substrate 12). The number of pads 14 corresponds to the number of interconnect members 30". In the illustrated embodiment, the interconnect members 30" are solder balls. The pads 14 can be made of metal or a metal or another suitable material that provides electrical and/or thermal conductivity between the solder balls 30" and the first component 10 (e.g., the one or more circuit components of the first component 10) and/or the second component 20. A solder mask 16 is disposed over at least a portion of the pad 14 to define an area where the interconnect member (e.g., solder ball) 30, 30', 30" may be applied (e.g., attached, dropped, deposited, formed) over the pad 14 and solder mask 16. In some implementations, the pad 14 can be non-solder mask defined or metal defined.

Figure 3:
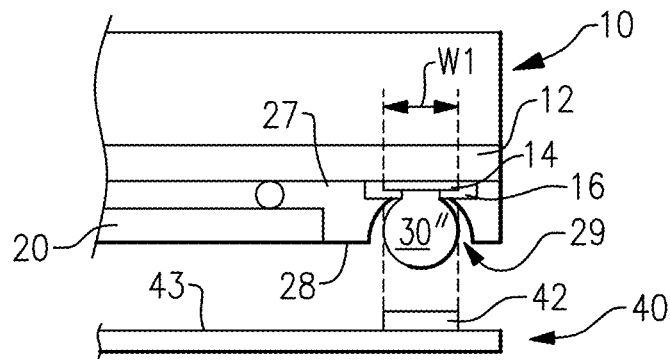
FIG. 3 is a schematic side view of the solder interconnect members in FIG. 2 opposite a pad on a mother board to which the solder interconnect members is connected.

FIG. 3 shows the enlarged partial view of the package 50 in FIG. 2 opposite a circuit board 40 (e.g., phone board, mother board) on which the package 50 is mounted. The circuit board 40 can have one or more pads 42 disposed on (e.g., attached to, formed on) the circuit board 40. The number of pads 42 can correspond to the number of pads 14, which correspond to the number of interconnect members 30" (e.g., solder balls). The pads 42 can be made of metal or a metal or another suitable material that provides electrical and/or thermal conductivity between the interconnect members 30" and the circuit board 40.

The package 50 mounts to the circuit board 40 via a connection between the interconnect members 30" and the pads 42. For example, at least a portion of the interconnect members 30" can be deposited/melted onto the pads 42 (e.g., by applying heat to the interconnect members 30" causing them to reflow). The package 50 can mount to the circuit board 40 so that the bottom surface 28 of the bottom overmold 27 is spaced apart (e.g., by a gap) from the top surface 43 of the circuit board 40, which can inhibit (e.g., prevent) damage to the second component 20 due to displacement of the package 50 relative to the circuit board 40 (e.g., due to flexing or dropping of the circuit board 40 with the package 50 mounted on it, or dropping of an electronic device, such as a smartphone incorporating the circuit board 40 and package 50). In one implementation, the pads 42 of the circuit board 40 have a uniform size (e.g., width) W1 that is substantially equal to (e.g., coincides with) a size (e.g., width at the centerline, diameter at widest portion) of the interconnect members 30" (e.g., the solder balls 30" have a uniform size), which match the size (e.g., width) of the pads 14 (e.g., the pads 14 have a uniform size).

Figure 4:
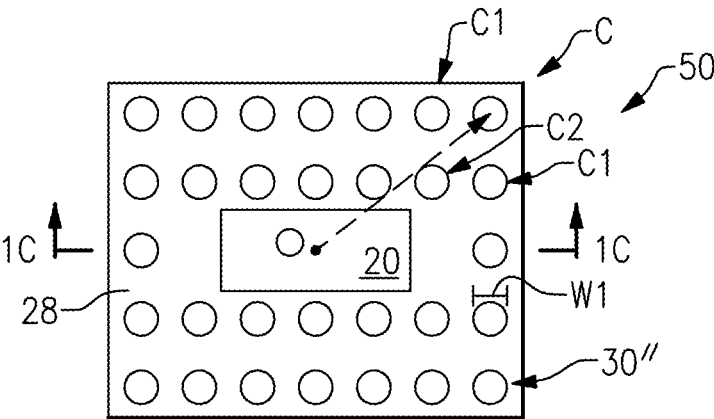
FIG. 4 is a schematic bottom view of the package of FIG. 1C.

FIG. 4 shows a bottom view of the package 50 in FIG. 1C. As discussed above, the interconnect members 30" can have a uniform size (e.g., substantially the same width at the centerline, diameter at widest portion) W1. When the package 50 is subjected to a drop test, the stress applied to the connections (e.g., through-mold connections, solder balls 30") of package 50 increases with distance from the center O of the package 50. Therefore, the interconnect members 30" at the corners C of the package 50 experience a higher level of stress from a drop test, and are therefore more likely to fail (e.g., exhibit cracks in the connection between the solder balls 30" and the pads 42 or pads 14), as compared to interconnect members 30" closer to the center of the package 50. With reference to FIG. 4, the interconnect members 30" (e.g., solder balls) at the corner C would experience greater stress during a drop test than the interconnect members 30" proximate the corner C (e.g., than the solder balls 30" at a position C1 next to the corner along the edge of the package 50, or at position C2 along a diagonal between the corner C and the center O of the package 50).

In accordance with one aspect of the disclosure, the inventor has recognized that failure rates of packages, such as the package 50, from drop tests can be significantly decreased by increasing the solder joint reliability of at least some (e.g., some, but not all) of the connections between interconnect members (such as solder balls 30") and pads (such as pads 14, 42) without increasing the size of the interconnect members (such as solder balls 30") relative to pads (e.g., pads 42) of the circuit board (e.g., circuit board 40). As described further below, in one implementation, the size of one or more pads (e.g., pads 14) of the package (e.g., package 50) can be increased relative to the size of one or more other pads (e.g., pads 14) of the package, while the size (e.g., exposed solderable area) of the interconnect members (e.g., solder balls 30") attached to the pads (e.g., pads 14) is uniform and coincides with the size of the pads (e.g., pads 42) of the circuit board (e.g., circuit board 40) on which the package (e.g., package 50) is mounted.

Figure 5A:
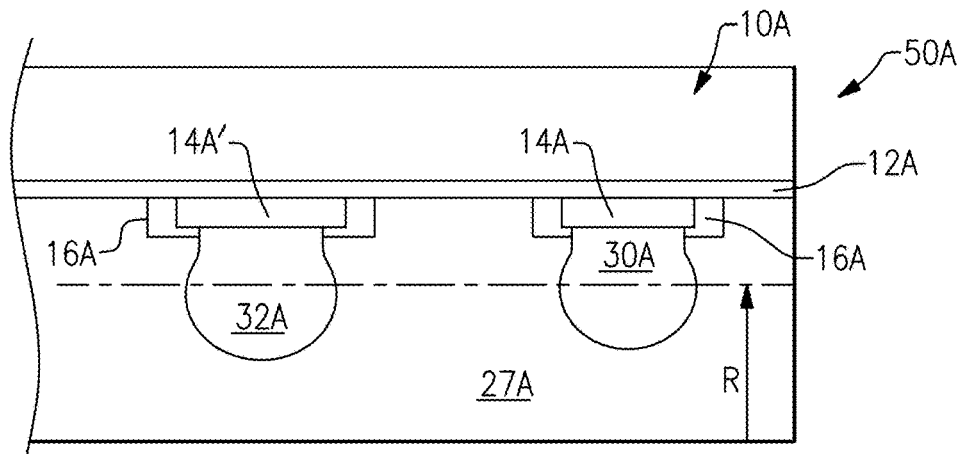
FIG. 5A is a schematic side view of two different sized solder interconnect members connected to different sized pads of a package following a bottom overmolding step.
Figure 5B:
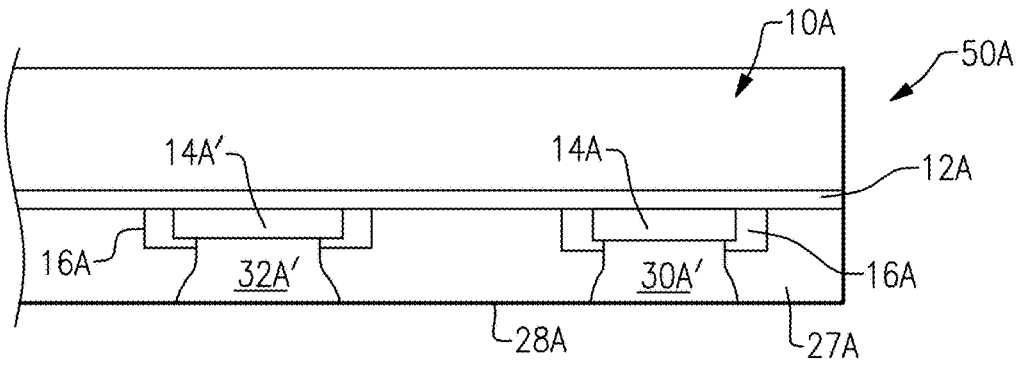
FIG. 5B is a schematic side view of the different sized solder interconnect members and pads of the package in FIG. 5A of the package following removal of bottom overmolding.
Figure 5C:
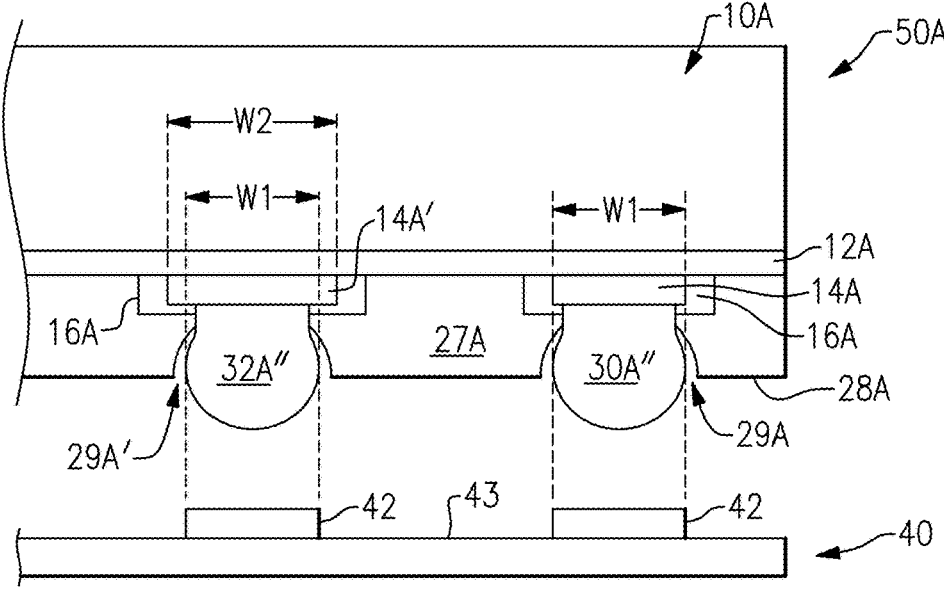
FIG. 5C is a schematic side view of the solder interconnect members and pads of FIG. 5B following reflowing of the solder interconnect members, the solder interconnect members shown opposite pads on a mother board to which the solder interconnect members are connected.

FIGS. 5A-5C are schematic partial enlarged views of interconnect members (e.g., solder balls) connected to different sized pads of a package 50A in different stages during the manufacturing process of the package 50A. Some of the features of the package 50A are similar to features of the package 50 in FIGS. 1A-4. Thus, reference numerals used to designate the various components of the package 50A are identical to those used for identifying the corresponding components of the package in FIGS. 1A-4, except that an "A" has been added to the numerical identifier. Therefore, the structure and description for the various features of the package 50 in FIGS. 1A-4 are understood to also apply to the corresponding features of the package 50A in FIGS. 5A-5C, except as described below.

Figure 5D:
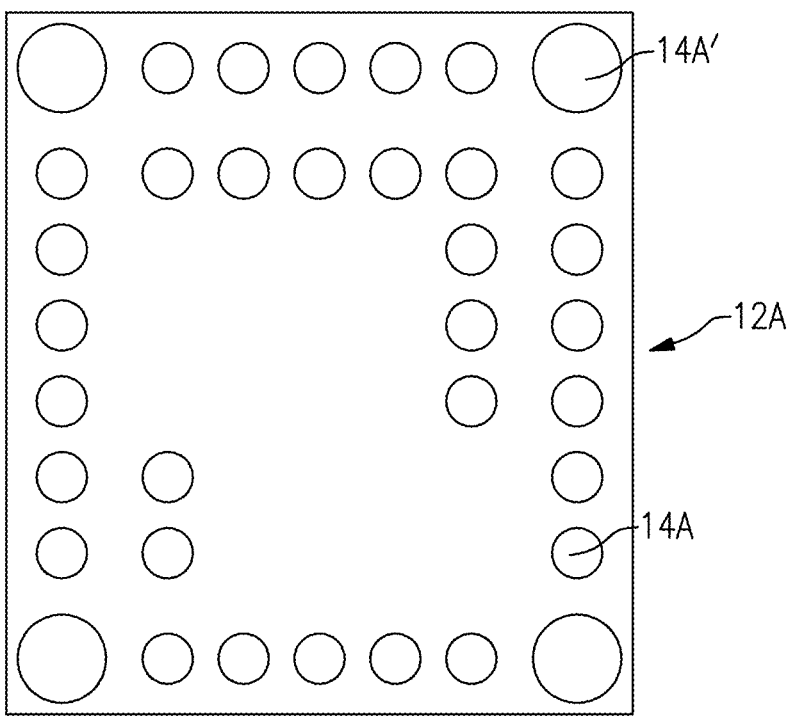
FIG. 5D is a schematic plan view of a bottom of a substrate showing the pads on the substrate, in accordance with one implementation.
Figure 5E:
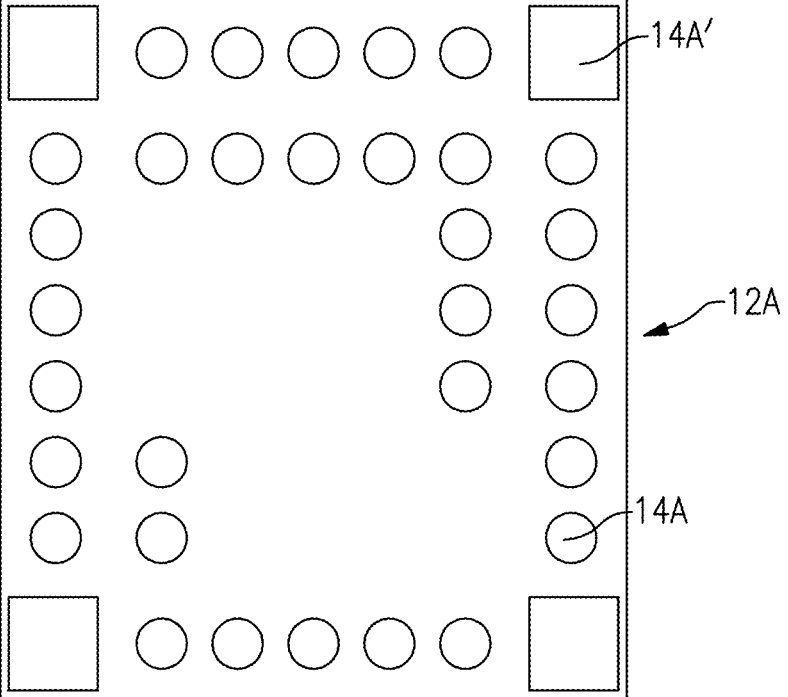
FIG. 5E is a schematic plan view of a bottom of a substrate showing the pads on the substrate, in accordance with one implementation.

The package 50A differs from the package 50 in that it has one or more first pads 14A having a first size (e.g., width) W1 and one or more second pads 14A' having a second size (e.g., width) W2 that is greater than the first size W1. In one implementation, the pads 14A, 14A' have a circular shape, as shown in FIG. 5D. In another implementation the pads 14A and/or pads 14A' have a square shape or other suitable shape, as shown in FIG. 5E. FIG. 5A shows the bottom overmold 27A completely covering one or more first interconnect members 30A (e.g., solder balls) and one or more second interconnect members 32A (e.g., solder balls) that are greater in size than the one or more first interconnect members 30A. In one implementation, the interconnect members 30A can be spherical and the interconnect members 32A can be larger spheres. In another implementation, the interconnect members 32A can be ovoid in shape in the Z direction (e.g., away from the pads 14A, 14A'). Though not shown, the package 50A can have a second component (similar to the second component 20). FIG. 5B shows at least a portion of the bottom overmold 27A and the interconnect members 30A, 32A removed (e.g., via ablation, via grinding) to expose at least a portion of the interconnect members 30A, 32A or through-mold connections through the bottom overmold 27A. In one implementation, the bottom overmold 27A and material of the interconnect members 30A, 32A is removed R to a location that coincides with a midline (e.g., meridian) of the interconnect members 30A, and a location that is past the midline or meridian of the interconnect members 32A. However, in other implementations, the bottom overmold 27A and material of the interconnect members 30A, 32A is removed R to a different location (e.g., below or above a midline or meridian of the interconnect members 30A, and a location that is below or above the midline or meridian of the interconnect members 32A. As shown in FIG. 5B, the interconnect members 30A, 32A, following the removal of said portion of the bottom overmold 27A and material of the interconnect members 30A, 32A, attain a non-spherical shape 30A', 32A' (e.g., a generally hemispherical shape, a spheric section). Advantageously, the interconnect members 30A', 32A' (e.g., following the removal step) have substantially the same volume of solder material.

FIG. 5C shows the interconnect members 30A", 32A" or through-mold connections after a reflow process in which the interconnect members 30A', 32A' change in shape from the non-spherical shape to a generally spherical shape. The interconnect members 30A", 32A" protrude past a bottom surface 28A of the bottom overmold 27A and have a shape (e.g., volume) that is smaller than a shape (e.g., volume) of the interconnect members 30A, 32A, respectively, so that a gap 29A, 29A' exists between the bottom overmold 27A and the interconnect members 30A", 32A" (e.g. a gap about the circumference of the solder ball 30A", 32A"), where the gap 29A' is greater than the gap 29A. The interconnect members 30A", 32A" have substantially the same size (e.g., width W1, width at the centerline, diameter at widest portion) or exposed solderable area and coincide with the size W1 of the pads 42 of the circuit board 40.

Advantageously, because the one or more pads 14A' have a greater size than the one or more pads 14A, the connection between the interconnect members 32A" (e.g., solder balls) and the pads 14A' have a higher strength and therefore a higher solder joint reliability, while the interconnect members 30A", 32A" (e.g., solder balls) have substantially the same size. Moreover, as the size W1 or exposed solderable area of the interconnect members 30A", 32A" is the same and coincides with the size W1 of the pads 42 of the circuit board 40, no changes are needed in the size of the pads 42 of the circuit board 40 (e.g., the pads 42 can have a uniform size that coincides with the size W1 or exposed solderable area of the solder balls 30A", 32A"). In one example, interconnect members 30A", 32A" can have an exposed solderable area or size (e.g., width at the centerline, diameter at widest portion) W1 of 250 microns, and the pads 42 of the circuitry board 40 can have a size (e.g., width) W1 of 250 microns. The pads 14A can also have a size (e.g., width, area) of 250 microns. The pads 14A' can have a size (e.g., width) of between about 300 microns and 350 microns (e.g., about 44% to 96% larger area than that of the pads 14A). In one implementation, the pads 14A' are located at one or more (e.g., all) corners C (see FIG. 4) of the package 50A. In another implementation, the pads 14A' are additionally or alternatively located at positions C1 next to the corner C (e.g., along the edge of the package 50A). In another implementation, the pads 14A' are additionally or alternatively located at positions C2 along a diagonal between the corner C and the center O of the package 50A. In another implementation, the larger pads 14A' can additionally or alternatively be located on the substrate 12A of the package 50A at locations that require increased thermal dissipation (e.g., from a circuit component attached to the substrate 12A at that location). In another implementation, the larger pads 14A' can additionally or alternatively be located on the substrate 12A of the package 50A at locations that require increased current carrying capacity or capability (e.g., from a circuit component attached to the substrate 12A at that location).

Figure 6:
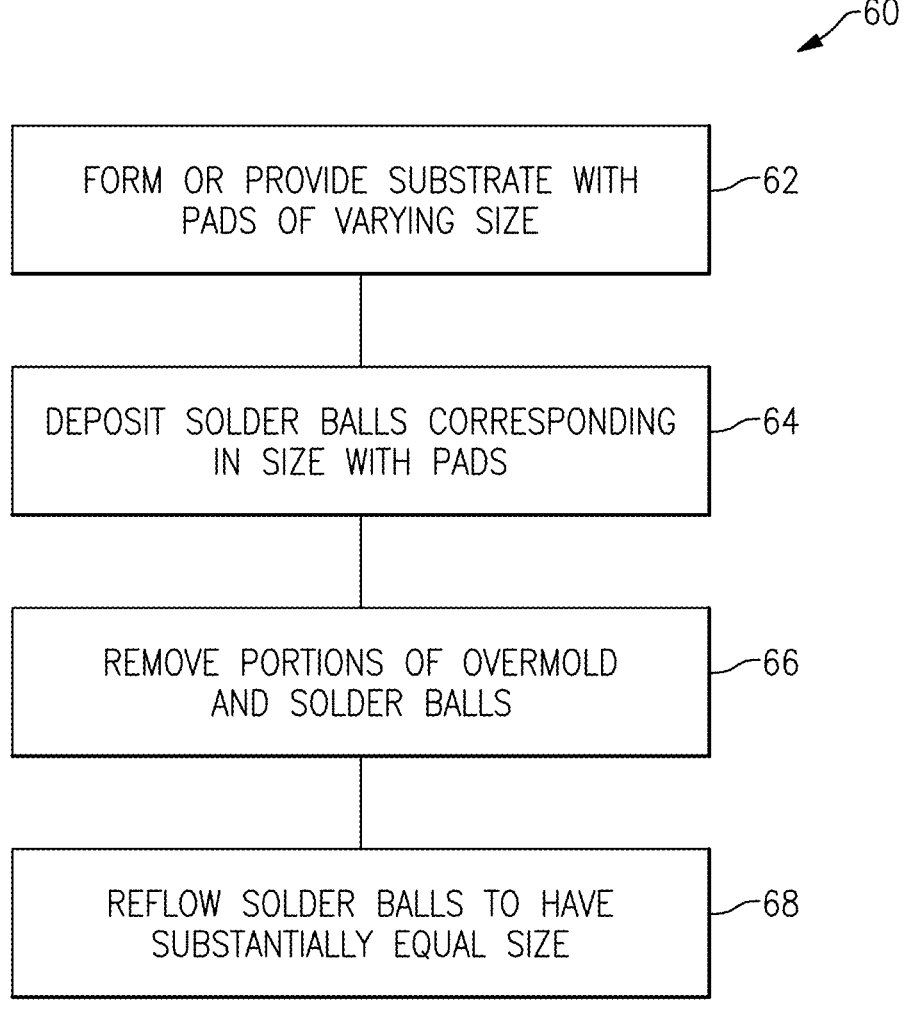
FIG. 6 shows a process for forming the solder interconnect members in FIG. 5C.

FIG. 6 shows a flowchart of a method or process 60 for forming a package, such as the package 50A of FIGS. 5A-5C. The method 60 includes the step 62 of forming or providing or forming a substrate with a plurality of first pads (e.g., pads 14A) and a plurality of second pads (e.g., pads 14A'), the second pads having a larger size than the first pads. The method 60 also includes the step 64 of depositing a plurality of interconnect members (e.g., solder balls, solder joints, metallic connection posts) on the plurality of pads, including depositing a first plurality of interconnect members (e.g., solder balls 30A) of a first size on the first pads and depositing a second plurality of interconnect members (e.g., solder balls 32A) of a second size larger than the first size onto the second pads. In one implementation, depositing the first plurality of interconnect members (e.g., solder balls 30A) and depositing the second plurality of interconnect members (e.g., solder balls 32A) occurs simultaneously. In another implementation, depositing the first plurality of interconnect members (e.g., solder balls 30A) and depositing the second plurality of interconnect members (e.g., solder balls 32A) occurs sequentially (e.g., the first solder balls deposited first, followed by the depositing of the second solder balls).

The method 60 includes the step 66 of removing a portion of a bottom overmold and a portion of the first interconnect members (e.g., solder balls 30A) and second interconnect members (e.g., solder balls 32A). In one implementation, the bottom overmold and interconnect members are removed via grinding. In another implementation, the bottom overmold and interconnect members are removed via ablation. In one implementation, the bottom overmold and interconnect members are removed so that the first interconnect members 1s (e.g., solder balls 30A) are reduced to the midline or meridian thereof, while the second interconnect members (e.g., solder balls 32A) are reduced to a location past the midline or meridian thereof (e.g., so that the remaining material, such as volume, of the solder balls 30A' and solder balls 32A' is substantially equal). The method 60 also includes the step 68 of reflowing a remaining portion of the first interconnect members (e.g., solder balls 30A') to form first final interconnect members (e.g., solder balls 30A") having a first size or exposed solderable area and reflowing a remaining portion of the second interconnect members (e.g., solder balls 32A') to form second final interconnect members (e.g., solder balls 32A") having a second size or exposed solderable area, the second size being smaller than the size of the second pads (e.g., pads 14A') and the first size for the first final interconnect members (e.g., solder balls 30A") being substantially equal to the size of the first pads (e.g., pads 14A). In one implementation, the first size and second size of the first final interconnect members (e.g., solder balls 30A") and second final interconnect members (e.g., solder balls 32A") is substantially equal. The method 60 can include other steps. For example, the method can include forming or attaching a shielded package (e.g., first component 10, 10A) on the first side of a substrate (e.g., substrate 12, 12A), and/or forming or providing a second package (e.g., second component 20, 20A) on the second side of the substrate (e.g., substrate 12, 12A) and between two or more of the plurality of interconnect members (e.g., solder balls 30A, 32A). In some implementations, the step 68 of reflowing the remaining portion of the first solder balls can be excluded.

In accordance with one aspect of the disclosure, the inventor has recognized that failure rates of packages, such as the package 50, from drop tests can be significantly decreased by increasing the solder joint reliability of at least some (e.g., some, but not all) of the connections between interconnect members (such as solder balls 30") and pads (such as pads 14, 42) by increasing the size of at least some (e.g., some but not all) of the interconnect members (such as solder balls 30") and their associated pads (e.g., pads 42) of the circuit board (e.g., circuit board 40), as well as associated pads (e.g., pads 14) of the package. As described further below, in one implementation, the size of one or more pads (e.g., pads 14) of the package (e.g., package 50) can be increased relative to the size of one or more other pads (e.g., pads 14) of the package, and the size (e.g., exposed solderable area) of their corresponding interconnect members (e.g., solder balls 30") attached to the pads (e.g., pads 14) is also increased relative to other interconnect members, and where the increased size of the pads of the package and interconnect members attached thereto coincide with a larger size of the pads (e.g., pads 42) of the circuit board (e.g., circuit board 40) on which the package (e.g., package 50) is mounted (e.g., as compared with other pads of the circuit board).

Figure 7A:
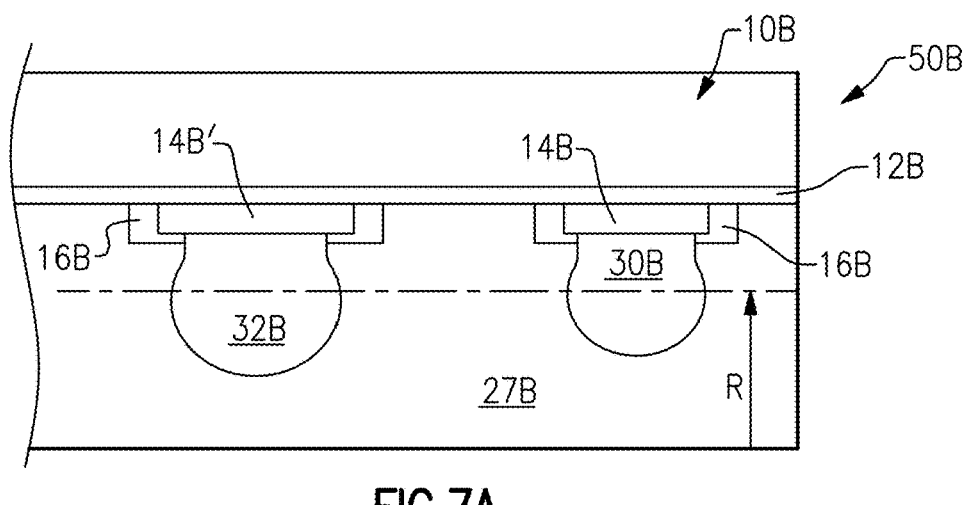
FIG. 7A is a schematic side view of two different sized solder interconnect members connected to different sized pads of a package following a bottom overmolding step.
Figure 7B:
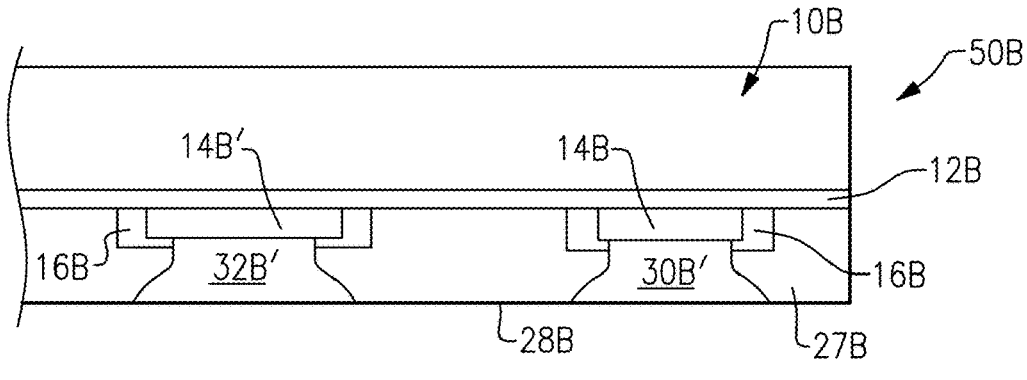
FIG. 7B is a schematic side view of the different sized solder interconnect members and pads of the package in FIG. 7A of the package following removal of bottom overmolding.
Figure 7C:
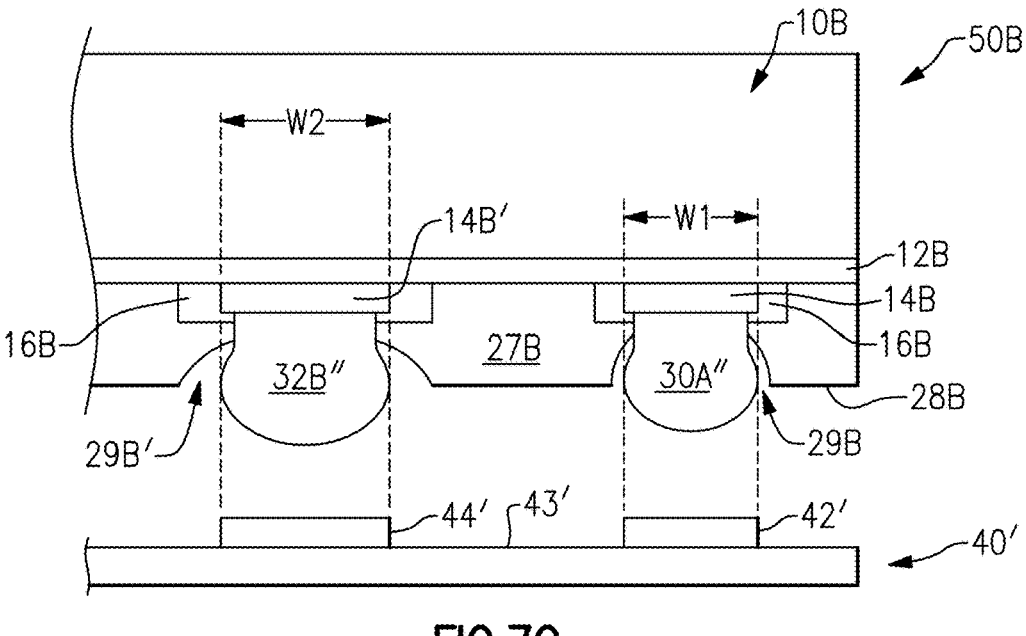
FIG. 7C is a schematic side view of the solder interconnect members and pads of FIG. 7B following reflowing of the solder interconnect members, the solder interconnect members shown opposite pads on a mother board to which the solder interconnect members are connected.

FIGS. 7A-7C are schematic partial enlarged views of interconnect members (e.g., solder balls) connected to different sized pads of a package 50B in different stages during the manufacturing process of the package 50B. Some of the features of the package 50B are similar to features of the package 50 in FIGS. 1A-4. Thus, reference numerals used to designate the various components of the package 50B are identical to those used for identifying the corresponding components of the package in FIGS. 1A-4, except that an "B" has been added to the numerical identifier. Therefore, the structure and description for the various features of the package 50 in FIGS. 1A-4 are understood to also apply to the corresponding features of the package 50B in FIGS. 7A-7C, except as described below.

The package 50B differs from the package 50 in that it has one or more first pads 14B having a first size (e.g., width) W1 and one or more second pads 14B' having a second size (e.g., width) W2 that is greater than the first size W1. In one implementation, the pads 14B, 14B' have a circular shape (e.g., similar to pads 14A, 14A' shown in FIG. 5D). In another implementation the pads 14B and/or pads 14B' have a square or rectangular shape or other suitable shape (e.g., similar to pads 14A, 14A' shown in FIG. 5E in plan view). FIG. 7A shows the bottom overmold 27B completely covering one or more first interconnect members 30B (e.g., solder balls) and one or more second interconnect members 32B (e.g., solder balls) that are greater in size than the one or more first interconnect members 30B. In one implementation, the interconnect members 30B can be spherical and the interconnect members 32B can be larger spheres. In another implementation, the interconnect members 32B can be ovoid in shape. Though not shown, the package 50B can have a second component (similar to the second component 20). FIG. 7B shows at least a portion of the bottom overmold 27B and the interconnect members 30B, 32B removed (e.g., via ablation, via grinding) to expose at least a portion of the interconnect members 30B, 32B or through-mold connections through the bottom overmold 27B. In one implementation, the bottom overmold 27B and material of the interconnect members 30B, 32B is removed R to a location that, for example, coincides with a midline (e.g., meridian) of the interconnect members 30B, and a location that, for example, is past the midline or meridian of the interconnect members 32B. As shown in FIG. 7B, the interconnect members 30B, 32B, following the removal of said portion of the bottom overmold 27B and material of the interconnect members 30B, 32B, attain a non-spherical shape 30B', 32B' (e.g., a generally hemispherical shape, a spheric section). Advantageously, the interconnect members 32B' (e.g., following the removal step) have a larger volume of solder material than the interconnect members 30B'.

FIG. 7C shows the interconnect members 30B", 32B" or through-mold connections after a reflow process in which the interconnect members 30B', 32B' change in shape from the non-spherical shape to a generally spherical shape (e.g., solder balls). The interconnect members 30B", 32B" protrude past a bottom surface 28B of the bottom overmold 27B and have a shape (e.g., volume) that is smaller than a shape (e.g., volume) of the interconnect members 30B, 32B, respectively, so that a gap 29B, 29B' exists between the bottom overmold 27B and the interconnect members 30B", 32B" (e.g. a gap about the circumference of the solder ball 30B", 32B"). In one implementation, the gap 29B' is greater than the gap 29B. The interconnect members 32A" have a larger size (e.g., width W2, width at the centerline, diameter at widest portion) or exposed solderable area than the size (e.g., width W2, width at the centerline, diameter at widest portion) of the interconnect members 30A". The size W2 of the interconnect members 32B" coincides with the size W2 of the pads 44' of the circuit board 40' to which the package 50B couples, and the size W1 of the interconnect members 30B" coincides with the size W1 of the pads 42' of the circuit board 40'.

Advantageously, because the one or more pads 14B' have a greater size than the one or more pads 14B, and the interconnect members 32B" (e.g., solder balls) have a larger size than the interconnect members 30B" (e.g., solder balls), the connection between the interconnect members 32B" and the pads 14B' have a higher strength and therefore a higher solder joint reliability. In one example, interconnect members 32B" can have an exposed solderable area or size (e.g., width at the centerline, diameter at widest portion) W2 of 230 microns and coincide with the size W2 of the pads 44' of the circuit board 40', and the interconnect members 30B" can have an exposed solderable area or size (e.g., width at the centerline, diameter at widest portion) W1 of 210 microns and coincide with the size W1 of the pads 42' of the circuit board 40'.

Figure 9:
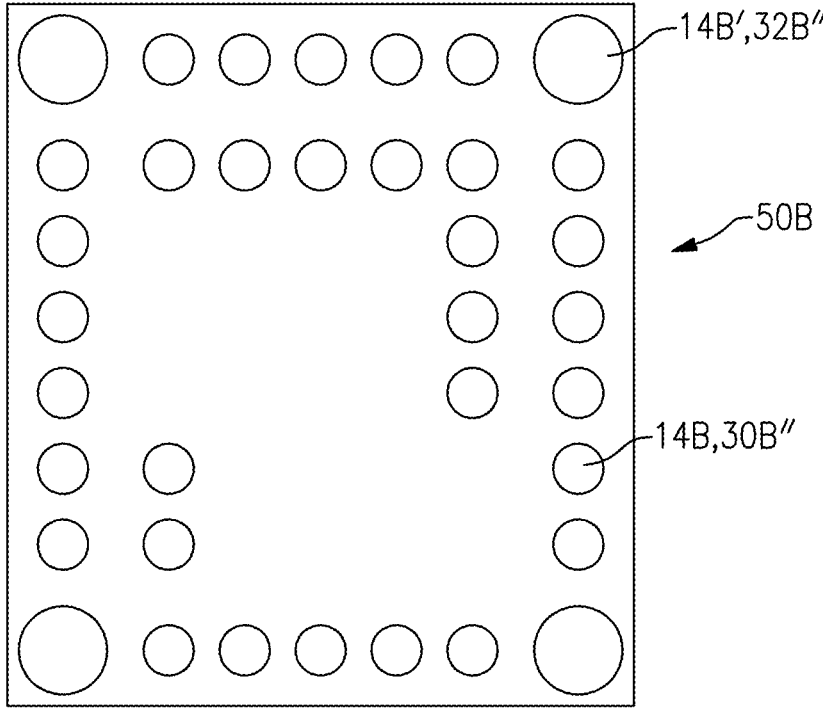
FIG. 9 is a is a schematic bottom view of a package having the solder interconnect members in FIG. 7C.

In one implementation, the pads 14B' and interconnect members 32B" (e.g., solder balls) are located at one or more (e.g., all) corners C (see FIG. 9) of the package 50B. In another implementation, the pads 14B' are additionally or alternatively located at positions C1 next to the corner C (e.g., along the edge of the package 50B). In another implementation, the pads 14B' are additionally or alternatively located at positions C2 along a diagonal between the corner C and the center O of the package 50B. In another implementation, the larger pads 14B' can additionally or alternatively be located on the substrate 12B of the package 50B at locations that require increased thermal dissipation (e.g., from a circuit component attached to the substrate 12B at that location). In another implementation, the larger pads 14B' can additionally or alternatively be located on the substrate 12B of the package 50B at locations that require increased current carrying capacity or capability (e.g., from a circuit component attached to the substrate 1BA at that location).

Figure 8:
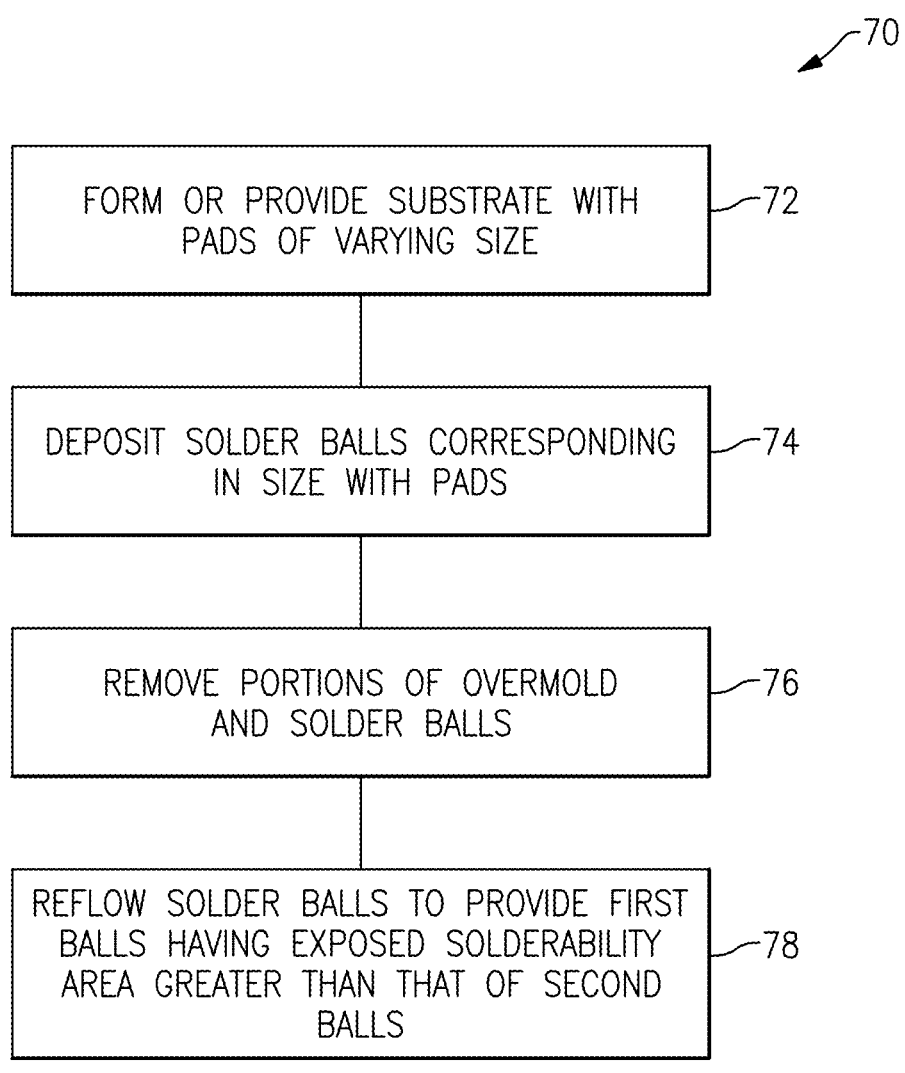
FIG. 8 shows a process for forming the solder interconnect members in FIG. 7C.

FIG. 8 shows a flowchart of a method or process 70 for forming a package, such as the package 50B of FIGS. 7A-7C. The method 70 includes the step 72 of forming or providing or forming a substrate with a plurality of first pads (e.g., pads 14B) and a plurality of second pads (e.g., pads 14B'), the second pads having a larger size than the first pads. The method 70 also includes the step 74 of depositing a plurality of interconnect members (e.g., solder balls) on the plurality of pads, including depositing a first plurality of interconnect members (e.g., solder balls 30B) of a first size on the first pads and depositing a second plurality of interconnect members (e.g., solder balls 32B) of a second size larger than the first size onto the second pads. In one implementation, depositing the first plurality of interconnect members (e.g., solder balls 30B) and depositing the second plurality of interconnect members (e.g., solder balls 32B) occurs simultaneously. In another implementation, depositing the first plurality of interconnect members (e.g., solder balls 30B) and depositing the second plurality of interconnect members (e.g., solder balls 32B) occurs sequentially (e.g., the first solder balls deposited first, followed by the depositing of the second solder balls).

The method 70 includes the step 76 of removing a portion of a bottom overmold and a portion of the first interconnect members (e.g., solder balls 30B) and second interconnect members (e.g., solder balls 32B). In one implementation, the bottom overmold and interconnect members are removed via grinding. In another implementation, the bottom overmold and interconnect members are removed via ablation. In one implementation, the bottom overmold and interconnect members are removed so that the first interconnect members (e.g., solder balls 30A) are reduced by a first amount, for example to the midline or meridian thereof, while the second interconnect members (e.g., solder balls 32A) are reduced by a second amount, for example to a location past the midline or meridian thereof (e.g., so that the remaining material, such as volume, of the solder balls 32B' is greater than the volume of the solder balls 30B'). The method 70 also includes the step 78 of reflowing a remaining portion of the first interconnect members (e.g., solder balls 30B') to form first final interconnect members (e.g., solder balls 30B") having a first size or exposed solderable area and reflowing a remaining portion of the second interconnect members (e.g., solder balls 32B') to form second final interconnect members (e.g., solder balls 32B") having a second size or exposed solderable area, the second size being substantially equal to the size of the second pads (e.g., pads 14B') and the first size for the first final interconnect members (e.g., solder balls 30B") being substantially equal to the size of the first pads (e.g., pads 14B). In one implementation, the first size of the first final interconnect members (e.g., solder balls 30B") is smaller than the second size of the second final interconnect members (e.g., solder balls 32B"). The method 70 can include other steps. For example, the method can include forming or attaching a shielded package (e.g., first component 10, 10A) on the first side of a substrate (e.g., substrate 12, 12A), and/or forming or providing a second package (e.g., second component 20, 20A) on the second side of the substrate (e.g., substrate 12, 12A) and between two or more of the plurality of interconnect members (e.g., solder balls 30B, 32B).

Figure 10:
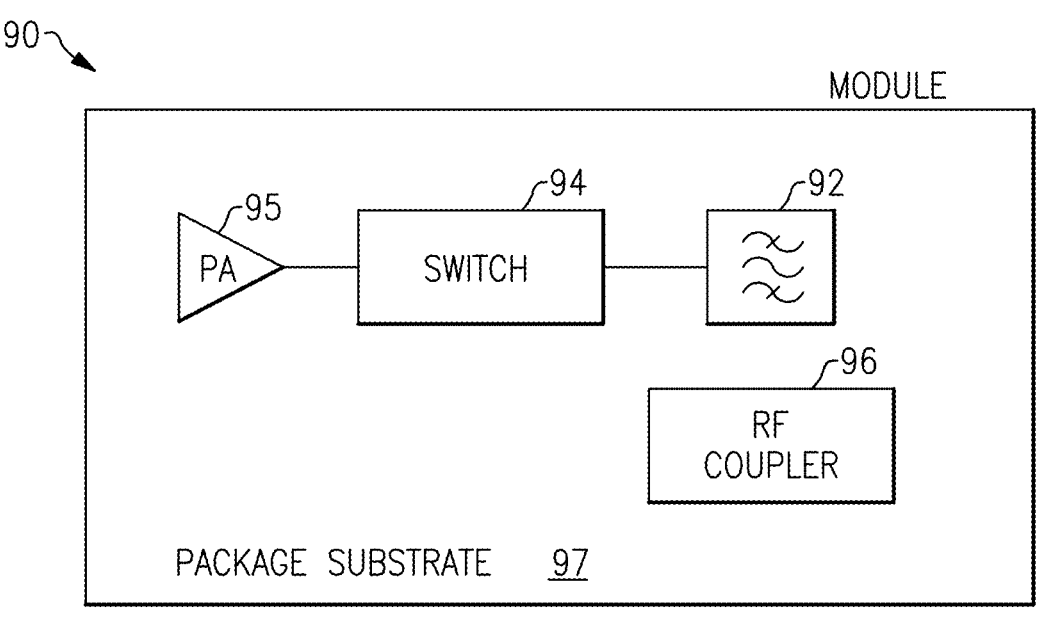
FIG. 10 is a schematic block diagram of a packaged module that includes a filter with an acoustic wave device according to an embodiment.

FIG. 10 is a schematic block diagram of a module 90 that includes a filter 92 with an acoustic wave device in accordance with any suitable principles and advantage disclosed herein. The module 90 includes the filter 92 that includes an acoustic wave device, a switch 94, a power amplifier 95, and a radio frequency (RF) coupler 96. The power amplifier 95 can amplify a radio frequency signal. The switch 94 can selectively electrically couple an output of the power amplifier 95 to the filter 92. The filter 92 can be a band pass filter. The filter 92 can be included in a duplexer or other multiplexer. The RF coupler 96 can be a directional coupler or any other suitable RF coupler. The RF coupler 96 can sample a portion of RF power in a transmit signal path and provide an indication of the RF power. The RF coupler 96 can be coupled to the transmit signal path in any suitable point, such as between an output of the power amplifier 95 and an input to the switch 94. The module 90 can include a package that encloses the illustrated elements. The filter 92 with the acoustic wave resonator can be disposed on a common packaging substrate 97 with the other illustrated elements of the module 90. The packaging substrate 97 can be a laminate substrate, for example.

Figure 11:
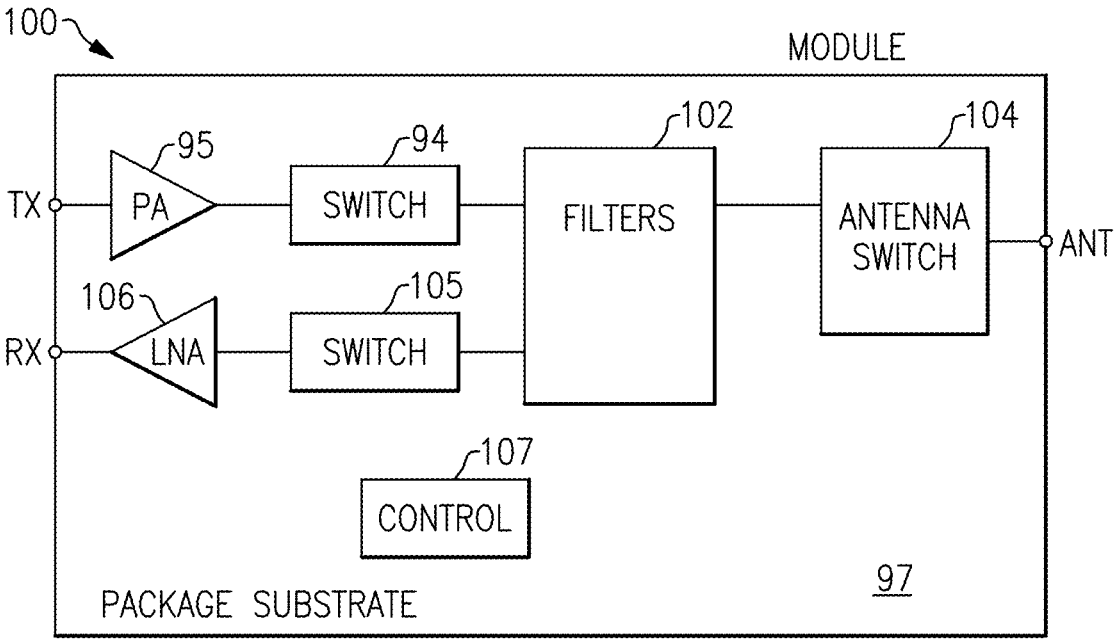
FIG. 11 is a schematic block diagram of a packaged module that includes a filter with an acoustic wave device according to another embodiment.

FIG. 11 is a schematic block diagram of a module 100 that includes filters 102 that include one or more acoustic wave devices in accordance with any suitable principles and advantage disclosed herein. As illustrated, the module 100 includes a power amplifier 95, a switch 94, filters 102, an antenna switch 104, a switch 105, a low noise amplifier 106, and a control circuit 107.

The power amplifier 95 can receive a radio frequency signal from a transmit port TX. In some instances, a switch can electrically connect a selected one of a plurality of transmit ports to an input of the power amplifier 95. The power amplifier 95 can operate in an envelope tracking mode and/or an average power tracking mode. The switch 94 can be a multi-throw radio frequency switch configured to electrically connect an output of the power amplifier 95 to one or more selected transmit filters of the filters 102. The switch 94 can be a band select switch arranged to electrically connect the output of the power amplifier 95 to a transmit filter for a particular frequency band.

The filters 102 can be acoustic wave filters. One or more resonators in any of the filters 102 can include a multi-layer IDT electrode in accordance with any suitable principles and advantages disclosed herein. In certain applications, all acoustic resonators of one or more filters of the filters 102 include a multi-layer IDT electrode in accordance with any suitable principles and advantages disclosed herein. The filters 102 can include a plurality of duplexers and/or other multiplexers. Alternatively or additionally, the filters 102 can include one or more standalone transmit filters and/or one or more standalone receive filters. The filters 102 can include at least four duplexers in some applications. According to some other applications, the filters 102 can include at least eight duplexers.

As illustrated, the filters 102 are electrically connected to the antenna switch 104. The antenna switch 104 can be a multi-throw radio frequency switch arranged to electrically connect one or more filters of the filters 102 to an antenna port ANT of the module 100. The antenna switch 104 can include at least eight throws in some applications. In certain applications, the antenna switch 104 can include at least ten throws.

A switch 105 can electrically connect a selected receive filter of the filters to a low noise amplifier 106. The low noise amplifier 106 is arranged to amplify the received radio frequency signal and provide an output to a receive port RX. In some instances, another switch can be electrically coupled between the low noise amplifier 106 and the receive port RX.

The illustrated module 100 also includes a control circuit 107. The control circuit 107 can perform any suitable control functions for the module 100.

Figure 12A:
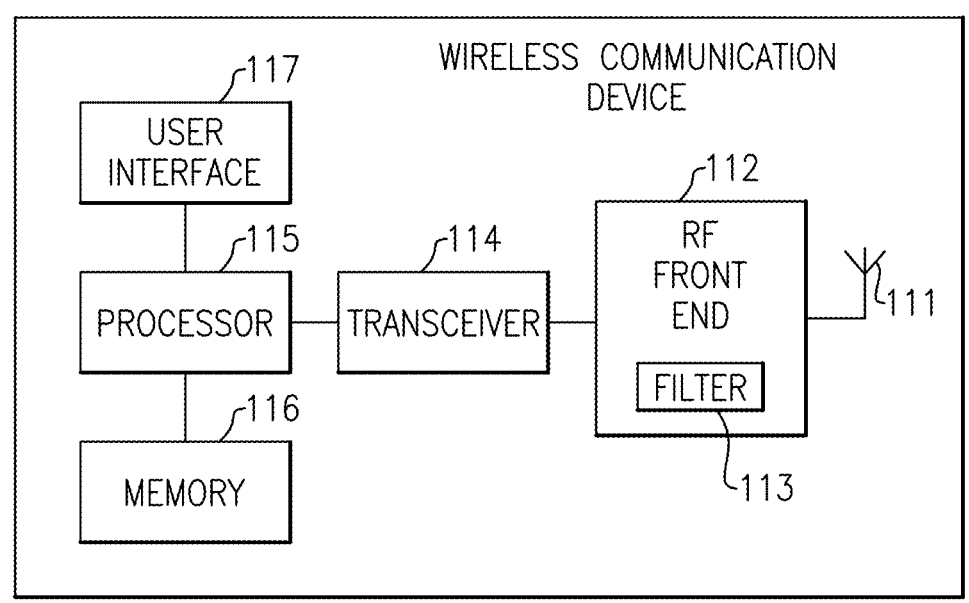
FIG. 12A is a schematic block diagram of a wireless communication device that includes a filter with an acoustic wave device according to an embodiment.

FIG. 12A is a schematic block diagram of a wireless communication device 110 that includes a filter 113 with an acoustic wave device. The wireless communication device 110 can be any suitable wireless communication device. For instance, a wireless communication device 110 can be a mobile phone, such as a smart phone. As illustrated, the wireless communication device 110 includes an antenna 111, an RF front end 112, an RF transceiver 114, a processor 115, a memory 116, and a user interface 117. The antenna 111 can transmit RF signals provided by the RF front end 112. The antenna 111 can provide received RF signals to the RF front end 112 for processing.

The RF front end 112 can include one or more power amplifiers, one or more low noise amplifiers, one or more RF switches, one or more receive filters, one or more transmit filters, one or more duplex filters, one or more filters of a multiplexer, one or more filters of a diplexer or other frequency multiplexing circuit, or any suitable combination thereof. The RF front end 112 can transmit and receive RF signals associated with any suitable communication standard. Any of the acoustic resonators disclosed herein can be implemented in filter 113 of the RF front end 112.

The RF transceiver 114 can provide RF signals to the RF front end 112 for amplification and/or other processing. The RF transceiver 114 can also process an RF signal provided by a low noise amplifier of the RF front end 112. The RF transceiver 114 is in communication with the processor 115. The processor 115 can be a baseband processor. The processor 115 can provide any suitable base band processing functions for the wireless communication device 110. The memory 116 can be accessed by the processor 115. The memory 116 can store any suitable data for the wireless communication device 110. The processor 115 is also in communication with the user interface 117. The user interface 117 can be any suitable user interface, such as a display.

Figure 12B:
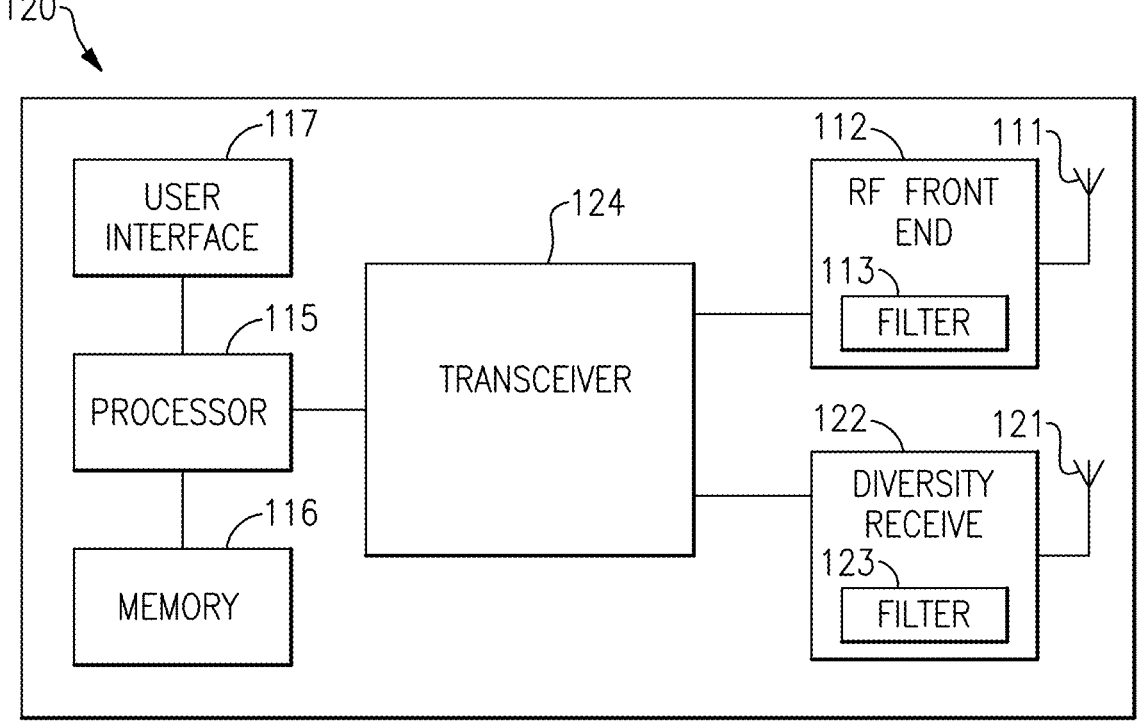
FIG. 12B is a schematic block diagram of a wireless communication device that includes a filter with an acoustic wave device according to another embodiment.

FIG. 12B is a schematic block diagram of a wireless communication device 120 that includes a radio frequency front end 112 with a filter 113 and a diversity receive module 122 with a filter 123 according to an embodiment. The wireless communication device 120 is like the wireless communication device 110 of FIG. 12A, except that the wireless communication device 120 also includes diversity receive features. As illustrated in FIG. 12B, the wireless communication device 120 includes a diversity antenna 121, a diversity receive module 122 configured to process signals received by the diversity antenna 121 and including filters 123, and a transceiver 124 in communication with both the radio frequency front end 112 and the diversity receive module 122. The filter 123 can include one or more acoustic wave resonators having any suitable interdigital transducer (IDT) electrode. The filter 123 can include one or more acoustic wave resonators having any suitable IDT electrode.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kilohertz (kHz) to 300 gigahertz (GHz), such as in a frequency range from about 450 MHz to 8.5 GHz. An acoustic wave resonator including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A dual sided molded package comprising:
   a substrate having a first side and an opposite second side;
   a plurality of pads attached to the second side of the substrate and including one or more first pads having a first surface area and one or more second pads having a second surface area that is smaller than the first surface area;
   a plurality of electrically conductive interconnect members attached to the plurality of pads and including one or more first interconnect members attached to the one or more first pads and having a first solderable area and one or more second interconnect members attached to the one or more second pads and having a second solderable area, the first solderable area being substantially equal to the first surface area and the second solderable area being substantially equal to the second surface area;
   an overmold on the second side of the substrate; and
   a gap between the overmold and the plurality of electrically conductive interconnect members.

2. The dual sided molded package of claim 1 wherein the first solderable area is larger than the second solderable area.

3. The dual sided molded package of claim 1 further comprising a shielded package attached to or formed on the first side of the substrate.

4. The dual sided molded package of claim 3 further comprising a second package attached to or formed on the second side of the substrate and disposed between two or more of the plurality of interconnect members.

5. The dual sided molded package of claim 4 wherein the second package is overmolded.

6. The dual sided molded package of claim 1 wherein the substrate has a square or rectangular shape in plan view, the first pads located at or proximate one or more corners of the substrate.

7. The dual sided molded package of claim 1 wherein the pads have a square shape in plan view.

8. A wireless device comprising:
   a circuit board having a plurality of metal pads including one or more first metal pads and one or more second metal pads, the one or more first metal pads having a larger surface area than a surface area of the second metal pads; and
   a dual sided molded package mounted on the circuit board, the dual sided molded package including a substrate having a first side and an opposite second side, a plurality of pads attached to the second side of the substrate and including one or more first pads having a first surface area and one or more second pads having a second surface area that is smaller than the first surface area, and a plurality of electrically conductive interconnect members attached to the plurality of pads and including one or more first interconnect members attached to the one or more first pads and having a first solderable area and one or more second interconnect members attached to the one or more second pads and having a second solderable area, the first solderable area being substantially equal to the first surface area and the second solderable area being substantially equal to the second surface area, the dual sided molded package further including an overmold on the second side of the substrate, and a gap between the overmold and the plurality of electrically conductive interconnect members, the first interconnect members and the second interconnect members being connected to the first metal pads and the second metal pads, respectively, the first solderable area being substantially equal to the surface area of the first metal pads, the second solderable area being substantially equal to the surface area of the second metal pads.

9. The wireless device of claim 8 wherein the first solderable area is larger than the second solderable area.

10. The wireless device of claim 8 further comprising a shielded package attached to or formed on the first side of the substrate.

11. The wireless device of claim 10 further comprising a second package attached to or formed on the second side of the substrate and disposed between two or more of the plurality of interconnect members.

12. The wireless device of claim 11 wherein the second package is overmolded.

13. The wireless device of claim 8 wherein the substrate has a square or rectangular shape in plan view, the first pads located at or proximate one or more corners of the substrate.

14. The wireless device of claim 8 wherein the pads have a square shape in plan view.

15. A package module comprising:
   a substrate;
   a package attached to a first side of the substrate;
   a plurality of pads attached to a second side of the substrate opposite the first side and including one or more first pads having a first surface area and one or more second pads having a second surface area that is smaller than the first surface area;
   a plurality of electrically conductive interconnect members attached to the plurality of pads and including one or more first interconnect members attached to the one or more first pads and having a first solderable area and one or more second interconnect members attached to the one or more second pads and having a second solderable area, the first solderable area being substantially equal to the first surface area and the second solderable area being substantially equal to the second surface area;
   an overmold on the second side of the substrate; and
   a gap between the overmold and the plurality of electrically conductive interconnect members.

16. The package module of claim 15 wherein the first solderable area is larger than the second solderable area.

17. The package module of claim 15 wherein the substrate has a round shape in plan view.

18. The package module of claim 15 wherein the first pads are located at or proximate one or more corners of the substrate.

19. The package module of claim 15 wherein the pads have a square shape in plan view.

20. The package module of claim 15 further comprising a shielded package attached to or formed on the first side of the substrate.

* * * * *